United States Patent [19]

Brindisi, Jr.

[11] 4,004,956
[45] Jan. 25, 1977

[54] SELECTIVELY STRIPPING TIN OR TIN-LEAD ALLOYS FROM COPPER SUBSTRATES

[75] Inventor: Frank A. Brindisi, Jr., Madison, Conn.

[73] Assignee: Enthone, Incorporated, West Haven, Conn.

[22] Filed: Aug. 14, 1974

[21] Appl. No.: 497,435

[52] U.S. Cl. .............................. 156/666; 156/635; 252/79.4; 252/79.3
[51] Int. Cl.$^2$ ....................................... C09K 13/08
[58] Field of Search .......... 252/79.3, 79.4; 156/18, 156/7; 134/3, 41

[56] References Cited

UNITED STATES PATENTS

| | | | |
|---|---|---|---|
| 2,652,360 | 9/1953 | Bond et al. | 252/79.4 |
| 3,061,494 | 10/1962 | Snyder et al. | 252/79.4 |
| 3,677,949 | 7/1972 | Brindisi et al. | 252/79.4 |
| 3,888,778 | 6/1975 | Beckwith et al. | 252/79.4 |

FOREIGN PATENTS OR APPLICATIONS

| | | | |
|---|---|---|---|
| 885,241 | 12/1961 | United Kingdom | 252/79.4 |

Primary Examiner—Douglas J. Drummond
Assistant Examiner—Jerome W. Massie
Attorney, Agent, or Firm—R. J. Drew; E. J. Schaffer

[57] ABSTRACT

Acidic solutions for selectively stripping tin or tin-lead alloys from copper substrates comprising an aqueous solution of at least one nitro-substituted aromatic compound; an inorganic acid capable of readily reacting with tin and lead to form water-soluble salts thereof and incapable of reacting with tin and lead to form a water-insoluble compound film on the tin or tin-lead alloy surface, preferably fluoboric acid; a thiourea; an organic acid of the formula RCOOH wherein R is 1–2C alkyl or hydrogen; and a haloacetic acid wherein the halogen is chloro or bromo. The haloacetic acid in combination with the acid of the formula RCOOH result in a pronounced synergism in accelerating the rate of stripping the tin or tin-lead alloy deposit from the copper substrate.

20 Claims, No Drawings

SELECTIVELY STRIPPING TIN OR TIN-LEAD ALLOYS FROM COPPER SUBSTRATES

BACKGROUND OF THE INVENTION

1. Field of the Invention

This invention relates to stripping tin or tin-lead alloys from copper substrates, and more particularly to new and improved compositions and method for selectively stripping tin or tin-lead alloys from copper substrates.

2. Description of the Prior Art

U.S. Pat. No. 3,677,949 to Brindisi et al discloses and claims acidic solutions for selectively stripping tin or tin-lead alloys from copper substrates. Such solutions are aqueous solutions comprising a nitro-substituted aromatic compound having one or more $-NO_2$ groups attached to the aromatic ring and a water-solubilizing substituent also attached to the aromatic ring, an inorganic acid capable of reacting with tin and lead to form water-soluble salts thereof, for example a fluorine-containing inorganic acid, e.g. fluoboric acid or fluosilicic acid, a thiourea, e.g. thiourea per se, for preventing re-deposition of stripped tin onto the copper, and as accelerator an acid of the formula RCOOH wherein R is 1–2C alkyl or a hydrogen atom. Although these stripper solutions give good results in stripping or dissolving the tin or tin-lead alloy from the copper substrate without any substantial attack of the copper, the solutions do leave room for improvement from the standpoint of the stripping rate. A desideratum is that the stripper solutions have a faster or more rapid stripping rate without any substantial or significant attack on the copper surface, and while preventing re-deposition of stripped tin onto the copper surface.

BRIEF SUMMARY OF THE INVENTION

It has now been found, in accordance with the present invention, that a synergistically enhanced, considerably more rapid stripping of the tin or tin-lead alloy from the copper substrate is attained, by having present in the acidic aqueous stripper solution of aforementioned U.S. Pat. No. 3,677,949 an effective amount of a haloacetic acid wherein the halo is chloro or bromo. The haloacetic acid in combination with the acid of the formula RCOOH wherein R is 1–2C alkyl or hydrogen results in a pronounced synergism in accelerating the rate of stripping the tin or tin-lead alloy from the copper substrate, resulting in a considerably faster or moe rapid stripping of the tin or tin-lead alloy from the copper substance than when either acid is used alone in the stripping solution.

The haloacetic acids utilizable herein are the mono-, di- and trichloroacetic acid and the mono-, di- and tribromoacetic acid. Mixtures of two or more of such haloacetic acids are also utilizable herein.

The nitro-substituted aromatic compound constituent having one or more $-NO_2$ groups attached to a benzene-ring carbon or carbons and the water-solubilizing substituent also attached to the benzene ring is exemplified by o-, m- and p-nitrobenzene sulfonic acids and mixtures thereof; o-, m- and p-nitrobenzoic acids and mixtures thereof; o-, m- and p-nitrochlorobenzenes and mixtures thereof; o-, m- and p-nitroanilines and mixtures thereof and o-, m- and p-nitrophenols and mixtures thereof. Other suitable nitro-substituted aromatic compounds for use in accordance with this invention are those disclosed in U.S. Pat. No. 2,649,361 to Springer and Meyer and U.S. Pat. No. 2,698,781 to Meyer.

Any inorganic acid capable of readily reacting with tin and lead to form water-soluble salts and which is incapable of forming a water-insoluble compound film on the tin or tin-lead alloy being stripped by reaction with the tin and/or lead is utilizable in the acidic stripper solution of this invention. Exemplary of such inorganic acid constituents are a fluorine-containing inorganic acid e.g. fluoboric acid and fluosilicic acid; and sulfamic acid.

The thiourea constituent is exemplified by thiourea per se; lower alkyl, i.e. 1–4C alkyl, thioureas, e.g. 1,3-dimethyl-2-thiourea, 1,3 diethyl-2-thiourea, 1,3-dipropyl-2-thiourea, and aryl thioureas, e.g. phenyl thiourea.

The thiourea constituent is essential in the stripper solutions of this invention to prevent re-deposition of stripped tin onto the copper.

It is essential to avoid formation of a water-soluble film on the surface of the tin or tin-lead alloy being stripped, inasmuch as the formation of such insoluble film will prevent stripping of the tin or tin-lead alloy. For this reason the inorganic acid constituent of the stripping bath herein, which is capable of readily reacting with tin and lead to form water-soluble salts, should also be incapable of forming a water-insoluble compound film on the surface of the tin, or tin-lead alloy under the conditions of the stripping, at least, by reaction with the tin and lead.

The stripping method of the invention involves contacting the tin or tin-lead alloy deposit on the copper substrate with the acidic aqueous solution comprising the haloacetic acid, the nitro-substituted aromatic compound, the inorganic acid capable of readily reacting with tin and lead to form water-soluble salts thereof and incapable of reacting with tin and lead to form a water-insoluble compound film on the metal surface, the thiourea and the compound of the formula RCOOH wherein R is a lower alkyl, e.g. methyl or propyl, radical or hydrogen atom; and continuing the contacting of the tin or tin-lead alloy on the copper substrate until the tin or tin-lead alloy is selectively dissolved from the copper substrate surface.

The contacting of the tin or tin-lead alloy on the copper with the acidic stripper solution is usually by immersing the tin or tin-lead alloy in the stripper solution or bath. However, any other suitable way of contacting the tin or tin-lead alloy with the stripper solution can be utilized.

The organic acid of the aforementioned formula RCOOH wherein R has the meaning aforesaid is utilized in the acidic stripper solutions herein to accelerate the rate of stripping removal of the tin or tin-lead alloy from the copper substrate. Such acid is utilized in the stripper solution in an effective amount, sufficient to accelerate the stripping removal of the tin or tin-lead alloy from the copper substrate.

The stripper solutions of this invention usually contain the constituents in proportions within the following proportion ranges:

---

Nitro-substituted aromatic compound having one or more -NO$_2$ groups attached to the aromatic ring nucleus and a water-solubilizing group also attached to the aromatic ring, e.g. sodium m-nitrobenzene sulfonate   0.1–180 g/l;
Inorganic acid capable of reacting with tin and lead to form water-soluble salts thereof and incapable of reacting with tin and lead to -continued

| | |
|---|---|
| form water-insoluble salts thereof, e.g. fluoboric acid | 3–500 g/l; |
| A thiourea, e.g. thiourea per se | 0.1–220 g/l; |
| Haloacetic acid wherein the halo is chloro or bromo, e.g. trichloracetic acid | 1–120 g/l; |
| Water | 10–990 g/l; |
| Organic acid of formula RCOOH wherein R is 1–2C alkyl or hydrogen, e.g. formic acid | 1–120 g/l; |

The present invention can be utilized to strip tin or tin-lead alloy or solder deposits from any copper substrate or surface for any desired purpose. This invention is especially eminently adapted for selectively stripping the tin-lead alloy solder deposits or layer from the copper-surfaced edge contact tabs or fingers in the preparation of printed circuit boards of this type.

In the embodiment of the method of this invention for selectively stripping the tin-lead binary alloy solder deposits from contact tabs or fingers in the preparation of printed circuit boards as disclosed in U.S. Pat. No. 3,677,949 of Brindisi et al, the method involves contacting the tin-lead binary alloy deposits of the contact tabs wherein the tabs each have the tin-lead binary alloy solder deposit over a copper layer with the aqueous acidic stripper solution of this invention. The contacting of the tin-lead alloy deposits of the tabs is continued until the tin-lead binary alloy or solder deposit is selectively dissolved from the copper.

The contacting of the tin-lead alloy deposits of the contact tabs of the printed circuit boards is usually by immersing only the contact tabs of the printed circuit board in the acidic stripper solution. Less preferably the contacting may be effected by spraying.

To facilitate the stripping of the tin-lead binary alloy or solder only from the contact tabs of the boards, those portions of the printed circuit board which are immediately adjacent and contiguous with the innermost end portions of the circuit board are blocked or masked off with a continuous resist layer which is resistant to and unaffected by the aqueous acidic stripper solution. This masking layer should be one that is readily removable manually or otherwise, and is exemplified by Scotch tape or an electrician's dielectric tape which is capable of withstanding and is unaffected by the acidic stripper solution.

A thin layer of gold is usually plated onto the exposed copper surfaces of the contact tabs after the stripping removal of the tin-lead alloy. Any suitable method of plating the gold onto the copper may be utilized, preferably after cleaning and activating the copper substrate. Immersion or ionic displacement plating of the gold onto the copper in conventional manner is an especially suitable method for plating the gold onto the copper of the contact tabs and is recommended. Immersion gold plating compositions are readily obtainable in commerce with one such gold plating composition being that marketed as "Atomex" by Engelhard Minerals and Chemicals Corp., Murray Hill, N.J. The thin gold layer is typically of thickness of 100–150 micro-inches.

Prior to plating the thin gold layer onto the exposed copper of the contact tabs, a thin barrier layer of nickel is usually plated onto and over the exposed copper surfaces of the tabs. The thin gold layer is then plated onto and over the nickel layer. In the absence of this intermediate nickel barrier layer, interdiffusion of the gold and copper may occur, and corrosion of the copper when pores are present in the gold layer may also occur with attendant tarnishing of the gold resulting in high contact resistance. The thin nickel layer may be plated onto the copper by any suitable method. One especially suitable method of plating the nickel over the copper is by electrodeposition in conventional manner utilizing an aqueous Ni plating bath of the following exemplary composition:

| | G/L |
|---|---|
| Nickel sulfate | 240–340 |
| Nickel chloride | 30–60 |
| Boric acid | 30–40 |

The nickel layer has a thickness of typically 1/10 to 3/10 of a mil.

In the case of the tin-lead alloys stripped by this invention, the tin-lead alloys are usually tin-lead binary alloys. The tin-lead binary alloys may contain, by weight, from about 1–99 tin, balance lead. The tin-lead solder alloy which can be stripped from the copper surfaces of the edge contact tabs or fingers of printed circuit boards as previously disclosed herein will typically contain, by weight, about 60% tin, balance lead. Incidental impurities may also be present in the tin-lead alloys stripped by this invention.

DESCRIPTION OF THE PREFERRED EMBODIMENTS

The mono-, di- and trichloroacetic acid are the preferred accelerators herein. Trichloroacetic acid is preferred among such chloroacetic acids.

When fluoboric acid is a constituent of the stripper solutions of this invention, boric acid is preferably also a constituent of the stripper solution or bath. Fluoboric acid undergoes a reversible reaction in the solution to form HF and $H_3BO_3$ as set forth in the following equation:

$$HBF_4 + 3H_2O \rightleftarrows 4HF + H_3BO_3$$

This reversible reaction is not desired for the reasons (1) HF that is formed combines with the lead to form the insoluble lead fluoride, i.e. $PB^{++} + 2HF \rightarrow PbF_2\downarrow + 2H^+$ and (2) the HF attacks the glass constituent of the epoxy printed circuit board thus etching the board. The addition of the boric acid causes the reversible equilibrium reaction to be shifted to the left in the direction of the desired fluoboric acid, i.e. $HBF_4$, in accordance with the Law of Mass Action. The boric acid constituent, as contrasted with the reaction product boric acid of the reversible reaction, is of course utilized in the stripper solution in an amount sufficient to cause the reversible equilibrium reaction to be shifted to the left, and is preferably utilized as a constituent in an amount within the range of about 1.0–120 g/l, more preferably about 10–60 g/l.

Preferably the stripper solutions herein contain the constituents in proportions within the following proportion ranges:

| | |
|---|---|
| Nitro-substituted aromatic compound having one or more -$NO_2$ groups attached to the aromatic ring nucleus and a water-solubilizing group also attached to the aromatic ring, e.g. | |

-continued

| | |
|---|---|
| sodium m-nitrobenzene sulfonate | 15–75 g/l; |
| Inorganic acid capable of reacting with tin and lead to form water-soluble salts thereof and incapable of reacting with tin and lead to form water-insoluble salts thereof, e.g. fluoboric acid | 75–300 g/l; |
| A thiourea, e.g. thiourea per se | 3.75–60 g/l; |
| Haloacetic acid wherein the halo is chloro or bromo, e.g. trichloroacetic acid | 3.75–30 g/l; |
| Water | to 1 liter |
| Organic acid of the formula RCOOH wherein R is 1–2C alkyl or hydrogen, e.g. formic acid | 7.5–22.5 g/l; |

The following examples further illustrate the invention:

Example 1

| | g/l |
|---|---|
| Thiourea | 15.00 |
| m-Nitrobenzene sulfonic acid sodium salt | 64.00 |
| Fluoboric acid | 150.00 |
| Trichloroacetic acid | 7.50 |
| Formic acid | 30.00 |
| Water | to 1 liter |

Example 2

| | g/l |
|---|---|
| Thiourea | 15.00 |
| m-Nitrobenzene sulfonic acid sodium salt | 64.00 |
| Fluoboric acid | 150.00 |
| Tribromoacetic acid | 7.50 |
| Formic acid | 30.00 |
| Water | to 1 liter |

Example 3

| | g/l |
|---|---|
| Thiourea | 15.00 |
| m-Nitrobenzene sulfonic acid sodium salt | 64.00 |
| Fluoboric acid | 150.00 |
| Monochloroacetic acid | 7.50 |
| Acetic acid | 15.00 |
| Water | to 1 liter |

Example 4

| | g/l |
|---|---|
| Thiourea | 15.00 |
| m-Nitrobenzene sulfonic acid sodium salt | 64.00 |
| Fluoboric acid | 150.00 |
| Boric acid | 7.50 |
| Dichloroacetic acid | 7.50 |
| Formic acid | 30.00 |
| Water | to 1 liter |

Example 5

| | g/l |
|---|---|
| Thiourea | 15.00 |
| m-Nitrobenzene sulfonic acid sodium salt | 64.00 |
| Fluoboric acid | 150.00 |
| Dibromoacetic acid | 7.50 |
| Formic acid | 30.00 |
| Water | to 1 liter |

Example 6

| | g/l |
|---|---|
| Thiourea | 15.00 |
| m-Nitrobenzene sulfonic acid sodium salt | 64.00 |
| Monobromoacetic acid | 7.50 |
| Fluoboric acid | 150.00 |
| Formic acid | 30.00 |
| Water | to 1 liter |

Example 7

| | g/l |
|---|---|
| Thiourea | 15.00 |
| m-Nitrobenzene sulfonic acid sodium salt | 64.00 |
| Trichloroacetic acid | 7.50 |
| Fluoboric acid | 150.00 |
| Boric acid | 7.50 |
| Propionic acid | 15.00 |
| Water | to 1 liter |

Example 8

| | g/l |
|---|---|
| 1,3-Dimethyl-2-thiourea | 30.00 |
| m-Nitrobenzene sulfonic acid sodium salt | 64.00 |
| Trichloroacetic acid | 7.50 |
| Fluoboric acid | 150.00 |
| Formic acid | 30.00 |
| Water | to 1 liter |

Example 9

| | g/l |
|---|---|
| 1,3-Dipropyl-2-thiourea | 30.00 |
| m-Nitrobenzene sulfonic acid ammonium salt | 64.00 |
| Trichloroacetic acid | 7.50 |
| Fluoboric acid | 150.00 |
| Formic acid | 30.00 |
| Water | to 1 liter |

Example 10

| | g/l |
|---|---|
| Phenyl thiourea | 30.00 |
| m-Nitrobenzene sulfonic acid sodium salt | 64.00 |
| Trichloroacetic acid | 7.50 |
| Fluoboric acid | 150.00 |
| Formic acid | 30.00 |
| Water | to 1 liter |

Example 11

| | g/l |
|---|---|
| Phenyl thiourea | 30.00 |
| m-Nitrobenzene sulfonic acid sodium salt | 64.00 |
| Tribromoacetic acid | 7.50 |
| Formic acid | 30.00 |
| Fluoboric acid | 150.00 |
| Water | to 1 liter |

Example 12

| | g/l |
|---|---|
| Thiourea | 15.00 |
| m-Nitrobenzene sulfonic acid ammonium salt | 64.00 |
| Trichloroacetic acid | 7.50 |
| Fluoboric acid | 150.00 |
| Formic acid | 30.00 |
| Boric acid | 7.50 |
| Water | to 1 liter |

Example 13

| | g/l |
|---|---|
| Thiourea | 7.50 |
| m-Nitrobenzene sulfonic acid sodium salt | 30.00 |
| Tribromoacetic acid | 7.50 |
| Sulfamic acid | 75.00 |
| Formic acid | 7.50 |
| Water | to 1 liter |

Example 14

| | g/l |
|---|---|
| 1,3-Diethyl-2-thiourea | 30.00 |
| m-Nitrobenzene sulfonic acid sodium salt | 64.00 |
| Trichloroacetic acid | 7.50 |
| Fluoboric acid | 150.00 |
| Formic acid | 30.00 |
| Boric acid | 7.50 |
| Water | to 1 liter |

Example 15

| | g/l |
|---|---|
| Thiourea | 15.00 |
| m-Nitrobenzene sulfonic acid sodium salt | 64.00 |
| Fluosilicic acid | 150.00 |
| Formic acid | 30.00 |
| Trichloroacetic acid | 7.50 |
| Water | to 1 liter |

Example 16

| | g/l |
|---|---|
| Phenyl thiourea | 30.00 |
| m-Nitrobenzene sulfonic acid sodium salt | 64.00 |
| Tribromoacetic acid | 7.50 |
| Fluosilicic acid | 150.00 |
| Formic acid | 30.00 |
| Water | to 1 liter |

Example 17

| | g/l |
|---|---|
| 1,3-Dimethyl-2-thiourea | 30.00 |

Example 1-continued

| | |
|---|---|
| m-Nitrobenzene sulfonic acid ammonium salt | 64.00 |
| Dichloroacetic acid | 7.50 |
| Fluosilicic acid | 150.00 |
| Formic acid | 30.00 |
| Water | to 1 liter |

Tests were carried out comparing stripper baths containing a haloacetic acid in accordance with the present invention with non-invention baths not containing a haloacetic acid, for stripping tin-lead solder deposits from copper-clad epoxy strips, under the following conditions and employing the following baths:

Operating Bath Conditions
1. Temperature: 75° F.
2. Agitation: None
3. Solution Volume: 1 liter Samples to be Stripped
1" × 1" × 0.125" copper-clad epoxy pieces plated with 1.0 mil of tin-lead solder (60/40)

Stripping Solutions
Bath No. 1

| Constituents | g/l |
|---|---|
| Thiourea | 15.00 |
| Na · meta nitrobenzene sulfonate | 64.00 |
| Formic acid (90%) | 30.00 |
| HBF₄ (48%) | 150.00 |
| Monochloroacetic acid | 7.50 |
| H₂O | to make 1 liter |

Bath No. 2

| Constituents | g/l |
|---|---|
| Thiourea | 15.00 |
| Na · meta nitrobenzene sulfonate | 64.00 |
| Formic acid (90%) | 30.00 |
| HBF₄ (48%) | 150.00 |
| Trichloroacetic acid | 7.50 |
| H₂O | to make 1 liter |

Bath No. 3

| Constituents | g/l |
|---|---|
| Thiourea | 15.00 |
| Na · metanitrobenzene sulfonate | 64.00 |
| Formic acid (90%) | 30.00 |
| HBF₄ (48%) | 150.00 |
| H₂O | to make 1 liter |

Bath No. 4

| Constituents | g/l |
|---|---|
| Thiourea | 7.50 |
| Na · meta nitrobenzene sulfonate | 30.00 |
| Formic acid (90%) | 15.00 |
| Sulfamic acid | 75.00 |
| H₂O | to make 1 liter |

Baths No. 1 and No. 2 in accordance with this invention completely stripped the tin-lead solder from the copper substrate in 3¾ minutes and 3 minutes respectively. However Bath No. 3 not of this invention required 10 minutes to completely strip the tin-lead solder from the copper substrate; and Bath No. 4 not of this invention had not completely stripped the tin-lead solder from the copper substrate in 10 minutes with a tin-lead solder deposit of thickness in excess of 0.0001 inch still remaining after 10 minutes.

What is claimed is:

1. In an acidic aqueous solution for selectively stripping tin or tin-lead alloy solder from a copper substrate comprising a nitro-substituted aromatic compound having at least one —NO₂ group attached to the aromatic ring and a water-solubilizing substituent also attached to the aromatic ring, an inorganic acid capable of reacting with tin and lead to form water-soluble salts thereof and incapable of reacting with tin and lead to form a water-insoluble compound film, a thiourea for preventing redeposition of stripped tin onto the copper substrate, and an organic acid of the formula RCOOH wherein R is 1–2C alkyl or a hydrogen atom, the improvement whereby a more rapid stripping of the tin or tin-lead alloy solder from the copper is provided, which comprises having present in the aqueous solution an effective amount of a haloacetic acid wherein the halo is chloro or bromo, the amount of said haloacetic acid being sufficient, in combination with said acid of the formula RCOOH wherein R has the meaning aforesaid, to synergistically accelerate the rate of stripping of the tin or tin-lead alloy solder from the copper substrate.

2. The solution of claim 1 wherein the haloacetic acid is present therein in amount within the range of 1 to 120 g/l.

3. The solution of claim 1 wherein the haloacetic acid is present therein in amount within the range of about 3.75 to 30.00 g/l.

4. The solution of claim 1 wherein the constituents are present therein in proportions within the following proportion ranges:

| | |
|---|---|
| Nitro-substituted aromatic compound having one or more -NO₂ groups attached to the aromatic ring nucleus and a water-solubilizing group also attached to the aromatic ring | 0.1–180 g/l |
| Inorganic acid capable of reacting with tin and lead to form water-soluble salts thereof and incapable of reacting with tin and lead to form a water-insoluble compound film | 3–500 g/l |
| A thiourea | 0.1–220 g/l |
| Haloacetic acid wherein the halo is chloro or bromo | 1–120 g/l |
| Organic acid of formula RCOOH wherein R is 1–2C alkyl or hydrogen | 1–120 g/l |
| Water | 10–990 g/l |

5. The solution of claim 1 wherein the constituents are present therein in proportions within the following proportion ranges:

| | |
|---|---|
| Nitro-substituted aromatic compound having one or more -NO₂ groups attached to the aromatic ring nucleus and a water-solubilizing group also attached to the aromatic ring | 15–75 g/l |
| Inorganic acid capable of reacting with tin and lead to form water-soluble salts thereof and incapable of reacting with tin and lead to form a water-insoluble compound film | 75–300 g/l |
| A thiourea | 3.75–60 g/l |
| Haloacetic acid wherein the halo is chloro or bromo | 3.75–30 g/l |
| Organic acid of formula RCOOH wherein R is 1–2 g alkyl or hydrogen | 7.5–22.5 g/l |
| Water | to 1 liter |

6. The solution of claim 1 wherein the haloacetic acid is a chloroacetic acid.

7. The solution of claim 6 wherein the chloroacetic acid is trichloroacetic acid.

8. The solution of claim 4 wherein the haloacetic acid is a chloroacetic acid.

9. The solution of claim 8 wherein the chloroacetic acid is trichloroacetic acid.

10. The solution of 1 wherein the inorganic acid is a fluorine-containing inorganic acid, the thiourea is thiourea per se, and the organic acid of the formula RCOOH is formic acid.

11. The solution of claim 4 wherein the inorganic acid is a fluorine-containing inorganic acid, the thiourea is thiourea per se, and the organic acid of the formula RCOOH is formic acid.

12. The solution of claim 10 wherein the fluorine-containing inorganic acid is fluoboric acid.

13. The solution of claim 10 wherein the fluorine-containing inorganic acid is fluosilicic acid.

14. The solution of claim 11 wherein the fluorine-containing inorganic acid is fluoboric acid.

15. The solution of claim 11 wherein the fluorine-containing inorganic acid is fluosilicic acid.

16. In a method for stripping tin or a tin-lead alloy deposited on a copper substrate from the copper comprising contacting the tin or tin-lead alloy on the copper substrate with an acidic aqueous solution comprising a nitro-substituted aromatic compound having at least one —NO$_2$ group attached to the aromatic ring and a water-solubilizing substituent also attached to the aromatic ring, an inorganic acid capable of reacting with tine and lead to form water-soluble salts thereof and incapable of reacting with tin and lead to form a water-insoluble compound film, a thiourea for preventing re-deposition of dissolved tin onto the copper substrate, an organic acid of the formula RCOOH wherein R is 1–2C alkyl or a hydrogen atom, and continuing the contacting of the tin or tin-lead alloy on the copper substrate with the acidic aqueous solution until the tin or tin-lead alloy is dissolved from the copper substrate surface, the improvement whereby a more rapid stripping of the tin or tin-lead alloy solder from the copper is provided which comprises having present in the acidic aqueous stripping solution during the stripping an effective amount of a haloacetic acid wherein the halo is chloro or bromo, the amount of said haloacetic acid being sufficient, in combination with said acid of the formula RCOOH wherein R has the meaning aforesaid, to synergistically accelerate the rate of stripping of the tin or tin-lead alloy solder from the copper substrate.

17. The method of claim 16 wherein the haloacetic acid is present in the stripping solution in amount within the range of 1 to 120 g/l.

18. The method of claim 16 wherein the haloacetic acid is present in the stripping solution in amount within the range of about 3.75 to 30.00 g/l.

19. The method of claim 16 wherein the haloacetic acid is a chloroacetic acid.

20. The method of claim 19 wherein the chloroacetic acid is trichloroacetic acid.

* * * * *